(12) United States Patent
Sung

(10) Patent No.: US 7,727,851 B2
(45) Date of Patent: Jun. 1, 2010

(54) METHOD OF MEASURING SHIFTED EPITAXY LAYER BY BURIED LAYER

(75) Inventor: Woong Je Sung, Seoul (KR)

(73) Assignee: Dongbu Electronics, Seoul (KR)

(*) Notice: Subject to any disclaimer, the term of this patent is extended or adjusted under 35 U.S.C. 154(b) by 653 days.

(21) Appl. No.: 11/644,896

(22) Filed: Dec. 26, 2006

(65) Prior Publication Data

US 2007/0155116 A1    Jul. 5, 2007

(30) Foreign Application Priority Data

Dec. 29, 2005    (KR) .................... 10-2005-0133582

(51) Int. Cl.
*H01L 21/76* (2006.01)
(52) U.S. Cl. ................ 438/400; 257/E21.531
(58) Field of Classification Search ................ 438/400; 257/E21.531
See application file for complete search history.

(56) References Cited

U.S. PATENT DOCUMENTS

2006/0011952 A1* 1/2006 Ohkawa .................... 257/291

* cited by examiner

*Primary Examiner*—W. David Coleman
*Assistant Examiner*—Sonya D McCall-Shepard
(74) *Attorney, Agent, or Firm*—Lowe Hauptman Ham & Berner LLP

(57) ABSTRACT

A method of measuring a shifted extent of a shifted epitaxy layer by an $N^+$ buried layer using difference between contact resistances is described. An N-type buried layer comprising a stepped portion is formed at a P-type substrate. An epitaxy layer is formed, comprising a stepped portion, on the N-type buried layer. A plug is formed in the epitaxy layer. An insulating layer is formed on the epitaxy layer. A plurality of contacts are formed in the insulating layer. Resistances of the plurality of contacts are measured and a shifting extent of the stepped portion of the epitaxy layer is calculated using the plurality of contact resistances.

6 Claims, 6 Drawing Sheets

US 7,727,851 B2

METHOD OF MEASURING SHIFTED EPITAXY LAYER BY BURIED LAYER

RELATED APPLICATION

The present application is related to, and claims priority from, Korean Patent Application No. 10-2005-0133582, filed Dec. 29, 2005, the entirety of which is hereby incorporated by reference herein in its entirety.

FIELD OF THE INVENTION

The present invention relates to fabrication technology of a semiconductor device and, more particularly, to a method of measuring a shifting extent of an epitaxy layer.

BACKGROUND OF THE INVENTION

A buried layer used in a semiconductor device is formed by diffusing $N^+$ impurities into a P-type substrate before growing an epitaxy layer. That is, the buried layer is formed inside the semiconductor device to provide a low resistance in a device current path. Antimony (Sb) or arsenic (As) is used as a dopant to form a typical buried layer.

In general, as shown in FIG. 1, prior to forming an epitaxy layer on a P-type substrate 10, a heavily-doped N-type buried layer 20 is formed below an active region on which a transistor will be formed. A function of the buried layer 20 is to secure a connection with the active region on which the transistor will be formed. Further, the buried layer 20 functions to provide junction insulation since the buried layer 20 is formed to have a conductivity type opposite to that of a substrate on which the epitaxy layer is formed. The buried layer 20 also causes the P-type substrate 10 to be suitably biased.

However, as shown in FIG. 2, after formation of the N-type buried layer 20, upon forming the epitaxy layer 30, a stepped portion 21 (FIG. 1) of the N-type buried layer 20 is partially positioned on the epitaxy layer 30. On the other hand, a stepped portion 31 formed at the epitaxy layer 30 is not formed at a position corresponding to the stepped portion 21 (FIG. 1) of the N-type buried layer 20, but is formed to be shifted by a distance 30a from the position corresponding to the stepped portion 21 (FIG. 1) thereof.

Accordingly, an $N^+$ plug 33 must be formed by applying an offset 32 by the shifted distance in order to compensate for the shifting as shown in FIG. 3. In this case, in order to measure the shifting extent of the stepped portion 21 (FIG. 1) of the epitaxy layer 30, a section of a wafer 10 must be cut and measured. However, to periodically perform the measurement, a number of wafers are used every time increasing fabrication cost and causing loss of time taken to analyze the section of the wafer.

SUMMARY OF THE INVENTION

It is, therefore, an object of the present invention to provide a method of measuring a shifted epitaxy layer by an $N^+$ buried layer using a difference between contact resistances.

In accordance with a preferred embodiment of the present invention, there is provided a method of measuring a shifted epitaxy layer by a buried layer, comprising the steps of: forming an N-type buried layer having a stepped portion at a P-type substrate; forming an epitaxy layer on the N-type buried layer having the stepped portion to obtain the epitaxy layer having a stepped portion; forming a plug in the epitaxy layer; forming an insulating layer on the epitaxy layer; forming a plurality of contacts in the insulating layer; and measuring resistances of the plurality of contacts, and calculating a shifting extent of the stepped portion of the epitaxy layer using the difference between the plurality of contact resistances.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION

Figure 1:
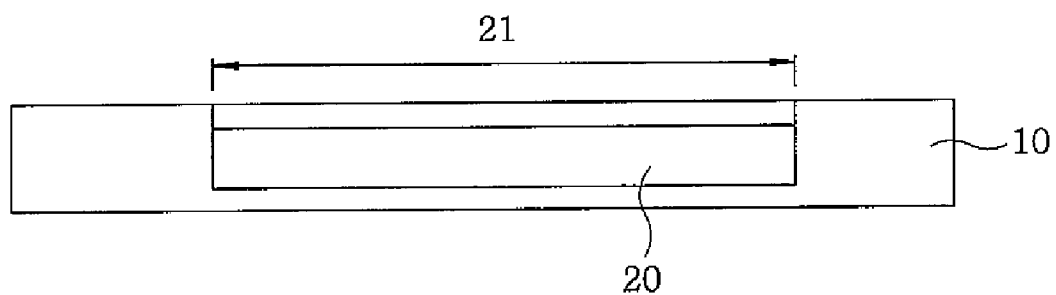
FIGS. 1 to 3 are cross-sectional views illustrating a shifted epitaxy layer by a buried layer.
Figure 2:
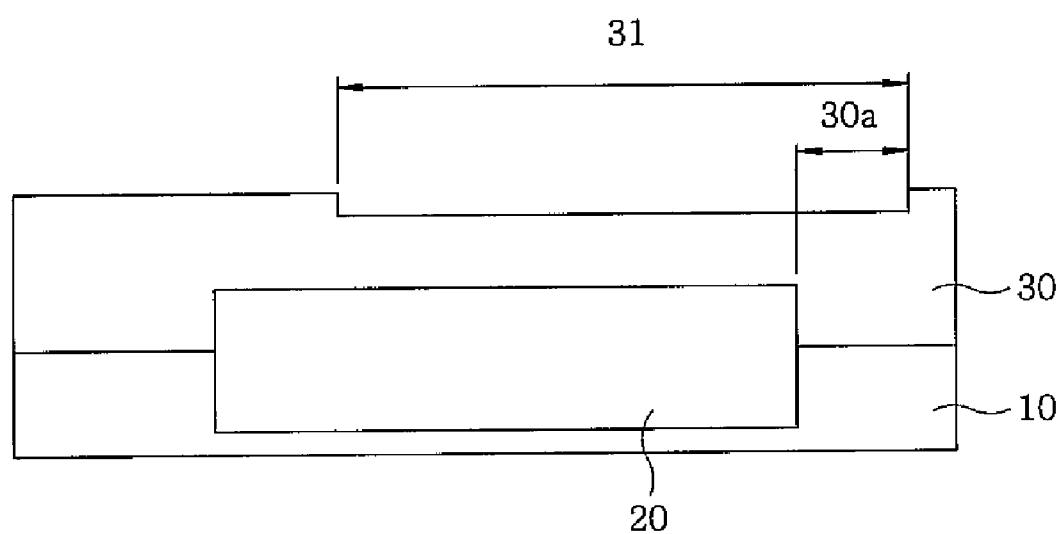
Figure 3:
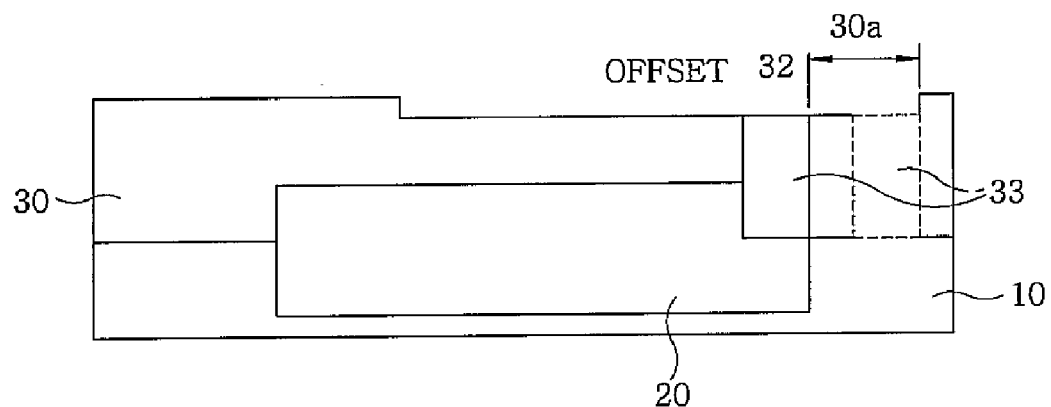

Hereinafter, some embodiments of the present invention will be described in detail with reference to the accompanying drawings so that they can be readily implemented by those skilled in the art.

The present invention will now be described more fully hereinafter with reference to the accompanying drawings, in which some embodiments of the invention are shown. This invention may, however, be embodied in different forms and should not be construed as limited to the embodiments set forth herein. Rather, these embodiments are provided as technical examples of the invention. In the drawings, the shapes of elements and the like are exaggerated for clarity. Like numbers refer to like elements.

FIGS. 4 to 10 are cross-sectional views sequentially illustrating a method of measuring a shifted epitaxy layer by a buried layer according to an embodiment of the present invention.

Figure 4:
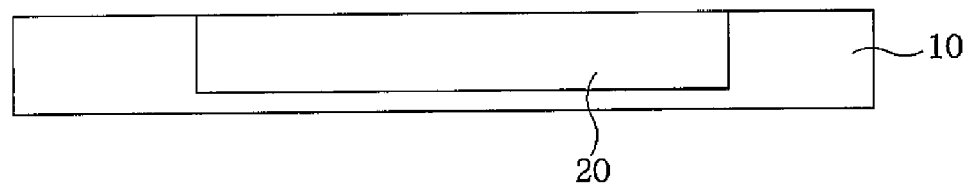
FIGS. 4 to 10 are cross-sectional views sequentially illustrating a method of measuring a shifted epitaxy layer by a buried layer according to an embodiment of the present invention.

With reference to FIG. 4, in order to form an N-type buried layer on a P-type wafer 10, an N-type dopant such as antimony (Sb) or arsenic (As) is ion-implanted. Here, a plurality of P-type wafers 10, for example, thirteen P-type wafers are provided, and the following process is performed.

Then, the wafer 10 in which the N-type dopant has been implanted is thermally treated, thereby to form a heavily-doped N-type buried layer 20. A function of the N-type buried layer 20 is to secure a connection with the active region on which the transistor will be formed. The N-type buried layer 20 is formed with a conductivity type opposite to that of a substrate on which the epitaxy layer is formed so as to secure the junction insulation. Further, the N-type buried layer 20 causes the wafer 10 to be suitably biased. The thermal treatment forms an oxide film at a thickness of about 1000 Å on the N-type buried layer 20.

Figure 5:
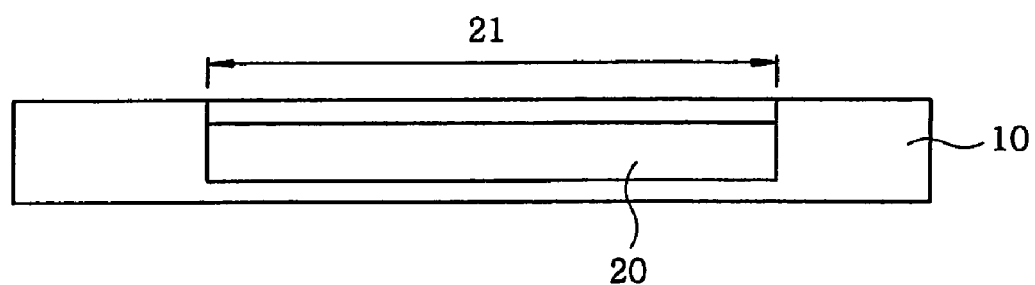

Then, as shown in FIG. 5, the oxide film formed on the N-type buried layer 20 is removed. Here, the N-type buried layer 20 has a stepped portion 21 at a thickness of about 1000 Å.

Figure 6:
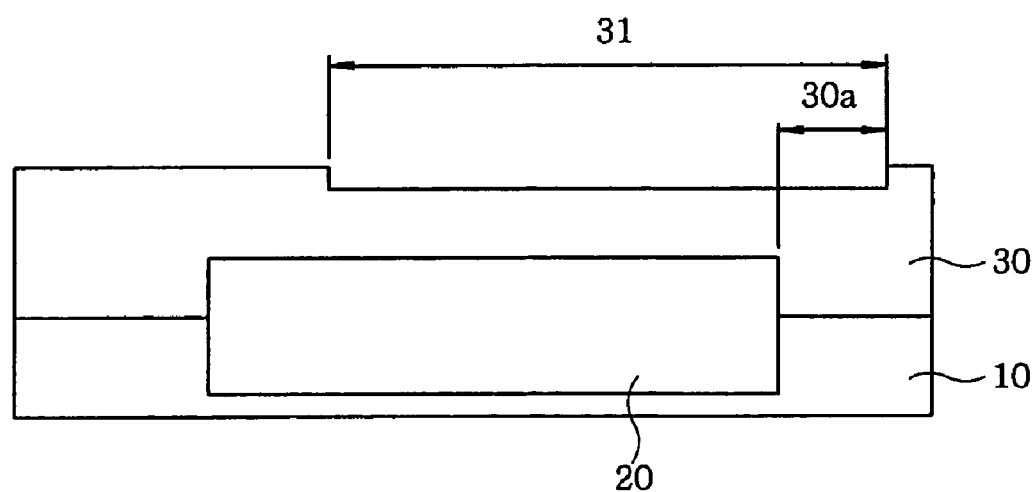

Then, as shown in FIG. 6, an epitaxy layer 30 is formed on the wafer 10 in which the N-type buried layer 20 is formed. Here, the epitaxy layer 30 is formed of a P-type epitaxy layer. Here, a stepped portion 21 of the N-type buried layer 20 is formed at the epitaxy layer 30. At this time, a stepped portion 31 formed at the epitaxy layer 30 is not formed at a position corresponding to the stepped portion 21 of the N-type buried layer 20, but is formed at a position shifted from the position corresponding to the stepped portion 21 by a shifted distance 30a. Further, a part of the N-type buried layer 20 expands to the epitaxy layer 30 so that the N-type buried layer 20 is widened.

Figure 7:
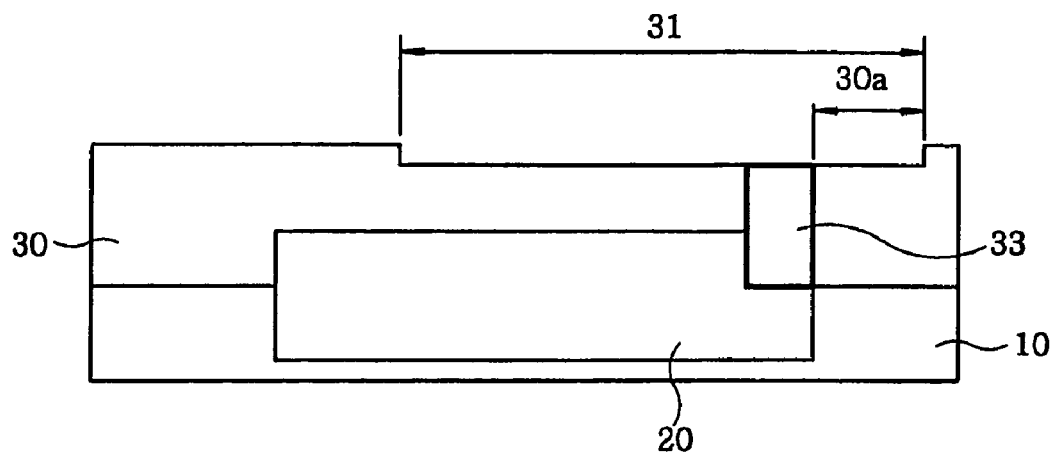

Then, as shown in FIG. 7, a deep N+ plug 33 is formed to be connected to the N-type buried layer 20 in the epitaxy layer 30.

Figure 8:
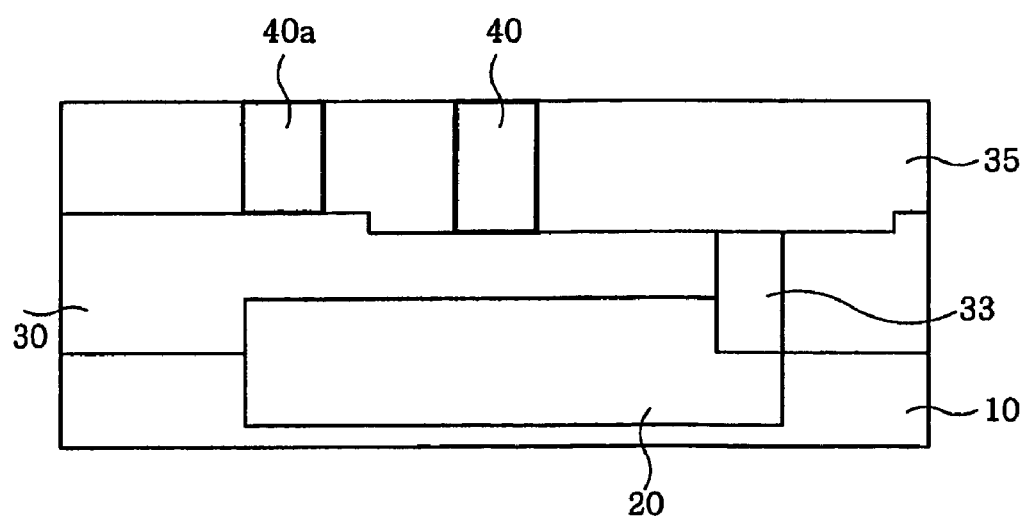

Then, as shown in FIG. 8, an insulating layer 35 is formed on the wafer 10 on which the epitaxy layer 30 is formed. Then, in order to measure the shifted extent of the stepped portion 21 (FIG. 5), which is formed at the epitaxy layer 30, contacts 40 and 40a are formed in the insulating layer 35.

Figure 9:
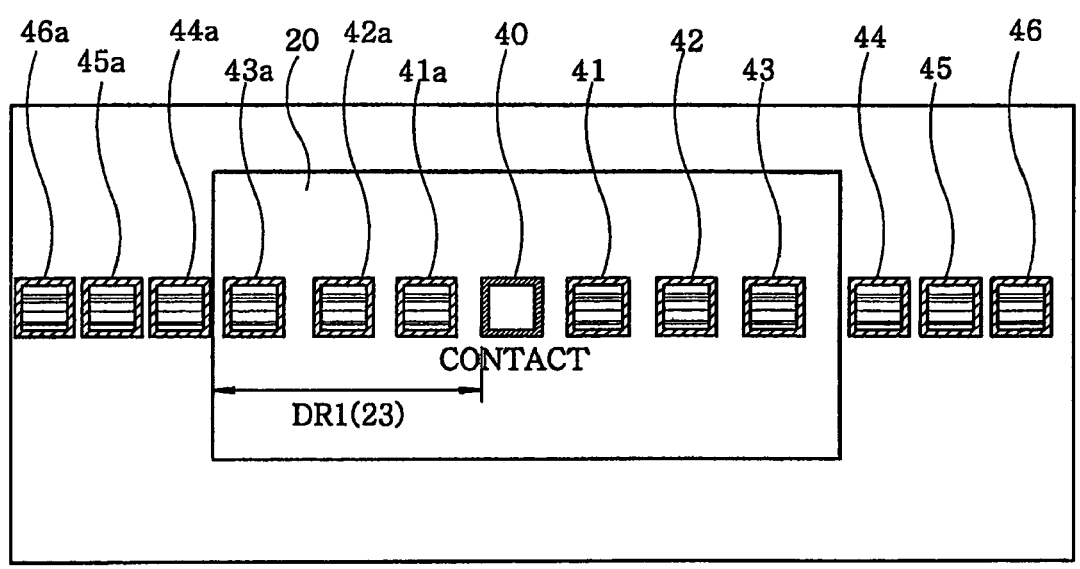

FIG. 9 indicates thirteen (13) contacts formed on thirteen (13) wafers from a view of one surface for clarity. Contact 40 is formed at a center of the N-type buried layer 20, that is, at a design rule (DR1) 23, and thus, a first contact 40 is formed in a first wafer.

Thereafter, six (6) contacts 41, 42, 43, 44, 45, and 46 are respectively formed in second to sixth wafers, which are located to the right from the first contact 40 of the first wafer, and the contacts 41, 42, 43, 44, 45, and 46 are spaced from one another at an interval of 1 μm. Further, six (6) contacts 41a, 42a, 43a, 44a, 45a, and 46a are respectively formed in second to sixth wafers 2a through 6a, which are located to the left from the first contact 40 of the first wafer, and the contacts 41a, 42a, 43a, 44a, 45a, and 46a are spaced from one another at an interval of 1 μm.

Accordingly returning to FIG. 8, a resistance of the contact 40 formed in the region of the epitaxy layer 30 in which the stepped portion 21 (FIG. 5) is present differs from that of the contact 40a formed in the region of the epitaxy layer 30 in which the stepped portion 21 is absent. The shifting extent of the stepped portion 21 of the epitaxy layer 30 is measured based on the resistance difference between the contact 40 and the contact 40a.

That is, a resistance of the contact 40 formed in the region in which the stepped portion 21 of the epitaxy layer 30 is present, is greater than that of the contact 40a formed in the region in which the stepped portion 21 of the epitaxy layer 30 is absent by about 15%. Accordingly, the shifting extent of the stepped portion 21 of the epitaxy layer 30 is measured based on the resistance difference between contact 40 and contact 40a. Thereby, resistances of the contacts of the 13 wafers are measured in the same manner, and thus, the shifting extent of the stepped portion 21 of the epitaxy layer 30 is measured.

Figure 10:
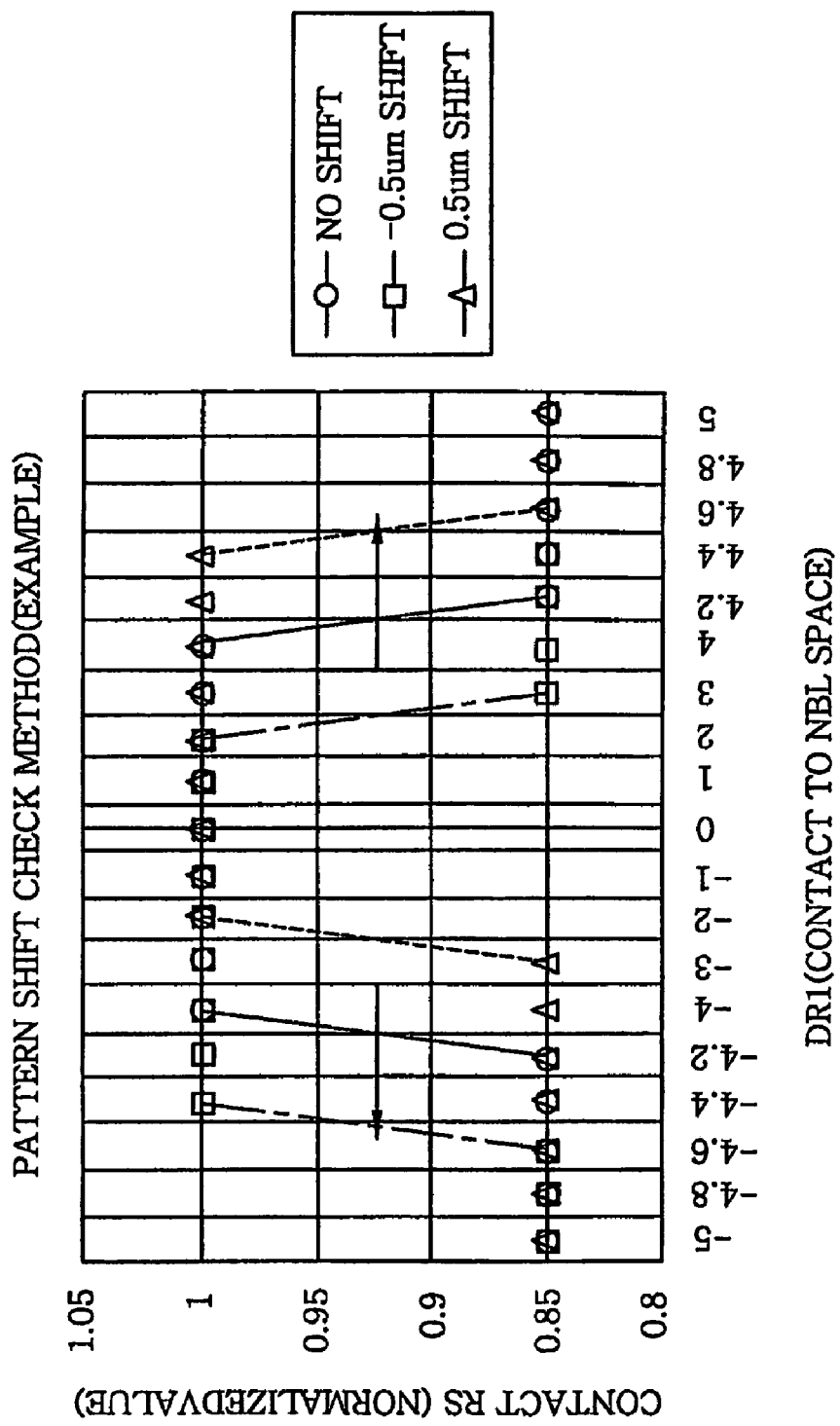

If the stepped portion 21 of the epitaxy layer 30 is shifted larger than an expected value, a contact resistance is not characterized by a bilateral symmetry, but is characterized by a shifting pattern as shown in FIG. 10. The shifting pattern provides a method of calculating the shifting extent of the stepped portion 21 of the epitaxy layer 30.

In the method of measuring a shifted epitaxy layer by an N+ buried layer according to the present invention, a contact is formed at a stepped portion of an epitaxy layer formed by a stepped portion of an N-type buried layer, and a contact resistance is measured. Thus, the shifting extent of the stepped portion of the epitaxy layer can be calculated based on the measured contact resistance.

Furthermore, according to the present invention, since the shifting extent of a stepped portion of the epitaxy layer is measured using a contact resistance difference, the cost loss caused by wafer cutting and the time loss due to section analysis of the wafer is removed.

In addition, according to the present invention, since the shifting extent of a stepped portion of the epitaxy layer may be measured using the contact resistance difference, periodic tests according to the present invention contribute to stabilization of fabrication processes and defect analysis.

While the invention has been shown and described with respect to the preferred embodiments, it will be understood by those skilled in the art that various changes and modifications may be made without departing from the spirit and scope of the invention as defined in the following claims.

What is claimed is:

1. A method of measuring a shifted extent of an epitaxy layer by a buried layer, comprising the steps of:
    forming an N-type buried layer comprising a stepped portion at a P-type substrate;
    forming an epitaxy layer on the N-type buried layer, the epitaxy layer comprising a stepped portion;
    forming a plug in the epitaxy layer;
    forming an insulating layer on the epitaxy layer;
    forming a plurality of contacts in the insulating layer;
    measuring respective contact resistances of the contacts and measuring differences between the plurality of contact resistances; and
    calculating a shifted extent of the stepped portion of the epitaxy layer from a position corresponding to the stepped portion of the N-type buried layer using the measured differences between the plurality of contact resistances.

2. The method of claim 1, wherein the forming a plug comprises forming an N+ plug connected to the N-type buried layer.

3. The method of claim 1, wherein the forming a plurality of contacts comprises forming the plurality of contacts at regions of an upper portion of the epitaxy layer in which the N-type buried layer is present and forming the plurality of contacts at regions of an upper portion of the epitaxy layer in which the N-type buried layer is absent.

4. The method of claim 3, wherein the forming a plurality of contacts comprises forming a plurality of contacts in a plurality of wafers, the contacts spaced apart from one another by an interval of 1 μm.

5. The method of claim 3, wherein the shifted extent of the stepped portion of the epitaxy layer is calculated based on that the contact resistances formed at the regions of the upper portion of the epitaxy layer where the N-type buried layer is present are different from the contact resistances formed at the regions of the upper portion of the epitaxy layer where the N-type buried layer is absent.

6. The method of claim 5, wherein the contact resistances formed at the region where the stepped portion of the epitaxy layer is present, are greater than those formed at the region where the stepped portion of the epitaxy layer is absent.

* * * * *